(12) United States Patent
Sohm et al.

(10) Patent No.: US 7,334,114 B2
(45) Date of Patent: Feb. 19, 2008

(54) REAL-TIME MONITORING, ALIGNMENT, AND TRANSLATION OF CPU STALLS OR EVENTS

(75) Inventors: Oliver P Sohm, Toronto (CA); Gary L. Swoboda, Sugar Land, TX (US); Manisha Agarwala, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 37 days.

(21) Appl. No.: 11/383,361

(22) Filed: May 15, 2006

(65) Prior Publication Data

US 2006/0265577 A1    Nov. 23, 2006

Related U.S. Application Data (60) Provisional application No. 60/681,427, filed on May 16, 2005, provisional application No. 60/681,543, filed on May 16, 2005.

(51) Int. Cl.
*G06F 11/00* (2006.01)
(52) U.S. Cl. .................................................. 712/227
(58) Field of Classification Search ................ 712/227; 714/30, 39, 45, 47, 37; 703/16, 17
See application file for complete search history.

(56) References Cited

U.S. PATENT DOCUMENTS

| | | | | | |
|---|---|---|---|---|---|
| 3,763,474 | A | * | 10/1973 | Freeman et al. | 714/38 |
| 4,435,759 | A | * | 3/1984 | Baum et al. | 714/44 |
| 5,737,240 | A | * | 4/1998 | Ellsworth et al. | 709/214 |
| 5,752,013 | A | * | 5/1998 | Christensen et al. | 712/227 |
| 5,761,492 | A | * | 6/1998 | Fernando et al. | 712/244 |
| 6,134,676 | A | * | 10/2000 | VanHuben et al. | 714/39 |
| 6,148,381 | A | * | 11/2000 | Jotwani | 711/158 |
| 6,336,139 | B1 | * | 1/2002 | Feridun et al. | 709/224 |
| 6,412,062 | B1 | * | 6/2002 | Xu et al. | 712/40 |
| 6,918,065 | B1 | * | 7/2005 | Edwards et al. | 714/45 |
| 7,210,127 | B1 | * | 4/2007 | Rangachari | 717/128 |
| 2002/0178403 | A1 | * | 11/2002 | Floyd et al. | 714/39 |

\* cited by examiner

*Primary Examiner*—Eric Coleman
(74) *Attorney, Agent, or Firm*—Robert D. Marshall, Jr.; W. James Brady; Frederick J. Telecky, Jr.

(57) ABSTRACT

A system and method of tracing a group of processor events in real-time in order to enable a programmer to debug and profile the operation and execution of code on the processor. This may be accomplished by running one or more traces on the same or different groups of processor events in order to gain a full understanding of how code is being executed by the processor.

10 Claims, 6 Drawing Sheets

REAL-TIME MONITORING, ALIGNMENT, AND TRANSLATION OF CPU STALLS OR EVENTS

CROSS-REFERENCE TO RELATED APPLICATIONS

This application claims the benefit of U.S. Provisional Application Ser. No. 60/681,543, filed May 16, 2005, titled "Real-Time Monitoring and Profiling System Events," and U.S. Provisional Application Ser. No. 60/681,427, filed May 16, 2005, titled "Debugging Software-Controlled Cache Coherence," both of which are incorporated by reference herein as if reproduced in full below.

This application also may contain subject matter that may relate to the following commonly assigned co-pending applications incorporated herein by reference: "Event and Stall Selection," Ser. No. 11/383,442, filed May 15, 2006 "Watermark Counter With Reload Register," Ser. No. 11/383,464, filed May 15, 2006, "Real-Time Prioritization of Stall or Event Information, " Ser. No. 11/383,465, filed May 15, 2006, "Method of Translating System Events into Signals For Activity Monitoring," Ser. No. 11/383,466 filed May 15, 2006, "System and Methods for Stall Monitoring." Ser. No. 11/383,472, filed May 15, 2006, "Monitoring of Memory and External Events, " Ser. No. 11/383,473, filed May 15, 2006 "Event Generating Instructions," Ser. No. 11/383,433, filed May 15, 2006, and "Selectively Embedding Event-Generating Instructions," Ser. No. 11/383,438, filed May 15, 2006

BACKGROUND

Integrated circuits are ubiquitous in society and can be found in a wide array of electronic products. Regardless of the type of electronic product, most consumers have come to expect greater functionality when each successive generation of electronic products are made available because successive generations of integrated circuits offer greater functionality such as faster memory or microprocessor speed. Moreover, successive generations of integrated circuits that are capable of offering greater functionality are often available relatively quickly. For example, Moore's law, which is based on empirical observations, predicts that the speed of these integrated circuits doubles every eighteen months. As a result, integrated circuits with faster microprocessors and memory are often available for use in the latest electronic products every eighteen months.

Although successive generations of integrated circuits with greater functionality and features may be available every eighteen months, this does not mean that they can then be quickly incorporated into the latest electronic products. In fact, one major hurdle in bringing electronic products to market is ensuring that the integrated circuits, with their increased features and functionality, perform as desired. Generally speaking, ensuring that the integrated circuits will perform their intended functions when incorporated into an electronic product is called "debugging" the electronic product. Also, determining the performance, resource utilization, and execution of the integrated circuit is often referred to as "profiling". Profiling is used to modify code execution on the integrated circuit so as to change the behavior of the integrated circuit as desired. The amount of time that debugging and profiling takes varies based on the complexity of the electronic product. One risk associated with the process of debugging and profiling is that it delays the product from being introduced into the market.

To prevent delaying the electronic product because of delay from debugging and profiling the integrated circuits, software based simulators that model the behavior of the integrated circuit are often developed so that debugging and profiling can begin before the integrated circuit is actually available. While these simulators may have been adequate in debugging and profiling previous generations of integrated circuits, such simulators are increasingly unable to accurately model the intricacies of newer generations of integrated circuits. Further, attempting to develop a more complex simulator that copes with the intricacies of integrated circuits with cache memory takes time and is usually not an option because of the preferred short time-to-market of electronic products. Unfortunately, a simulator's inability to effectively model integrated circuits results in the integrated circuits being employed in the electronic products without being debugged and profiled fully to make the integrated circuit behave as desired.

SUMMARY

Disclosed herein is a system and method of tracing a group of processor events in real-time to enable a programmer to debug and profile the operation and execution of code on the processor. Tracing the processor events may be accomplished by running one or more traces on the same or different groups of processor events in order to gain a full understanding of how code is being executed by the processor.

Tracing the processor events may be implemented by sending a series of instructions to an integrated circuit configured to execute the instructions and output event data corresponding to the execution of said instructions. A monitoring device may be coupled to the integrated circuit and is configured to input data corresponding to the event data.

BRIEF DESCRIPTION OF THE DRAWINGS

For a detailed description of exemplary embodiments of the invention, reference will now be made to the accompanying drawings in which.

DETAILED DESCRIPTION

Figure 1:
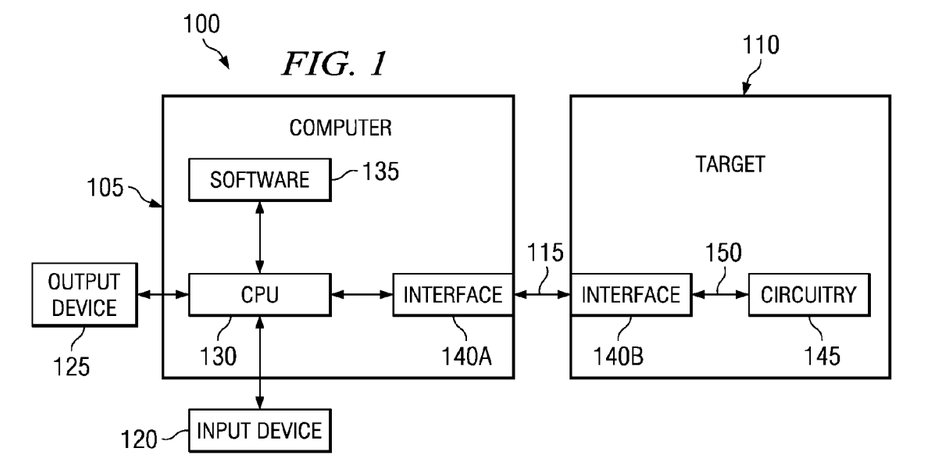
FIG. 1 depicts an exemplary debugging and profiling system in accordance with a preferred embodiment of the invention.

FIG. 1 depicts an exemplary debugging and profiling system 100 including a host computer 105 coupled to a target device 110 through a connection 115. A user may debug and profile the operation of the target device 110 by operating the host computer 105. The target device 110 may be debugged and profiled in order for the operation of the target device 110 to perform as desired (for example, in an optimal manner) with circuitry 145. To this end, the host computer 105 may include an input device 120, such as a keyboard or mouse, as well as an output device 125, such as a monitor or printer. Both the input device 120 and the output device 125 couple to a central processing unit 130 (CPU) that is capable of receiving commands from a user and executing software 135 accordingly. Software 135 interacts with the target 110 and may allow the debugging and profiling of applications that are being executed on the target 110.

Connection 115 couples the host computer 105 and the target device 110 and may be a wireless, hard-wired, or optical connection. Interfaces 140A and 140B may be used to interpret data from or communicate data to connection 115 respectively according to any suitable data communication method. Connection 150 provides outputs from the circuitry 145 to interface 140B. As such, software 135 on host computer 105 communicates instructions to be implemented by circuitry 145 through interfaces 140A and 140B across connection 115. The results of how circuitry 145 implements the instructions is output through connection 150 and communicated back to host computer 105. These results are analyzed on host computer 105 and the instructions are modified so as to debug and profile applications to be executed on target 110 by circuitry 145.

Connection 150 may be a wireless, hard-wired, or optical connection. In the case of a hard-wired connection, connection 150 is preferably implemented in accordance with any suitable protocol such as a Joint Testing Action Group (JTAG) type of connection. Additionally, hard-wired connections may include a real time data exchange (RTDX) type of connection developed by Texas instruments, Inc. Briefly put, RTDX gives system developers continuous real-time visibility into the applications that are being implemented on the circuitry 145 instead of having to force the application to stop, via a breakpoint, in order to see the details of the application implementation. Both the circuitry 145 and the interface 140B may include interfacing circuitry to facilitate the implementation of JTAG, RTDX, or other interfacing standards.

The target 110 preferably includes the circuitry 145 executing code that is actively being debugged and profiled. In some embodiments, the target 110 may be a test fixture that accommodates the circuitry 145 when code being executed by the circuitry 145 is being debugged and profiled. The debugging and profiling may be completed prior to widespread deployment of the circuitry 145. For example, if the circuitry 145 is eventually used in cell phones, then the executable code may be designed using the target 110.

The circuitry 145 may include a single integrated circuit or multiple integrated circuits that will be implemented as part of an electronic device. For example, the circuitry 145 may include multi-chip modules comprising multiple separate integrated circuits that are encapsulated within the same packaging. Regardless of whether the circuitry 145 is implemented as a single-chip or multiple-chip module, the circuitry 145 may eventually be incorporated into an electronic device such as a cellular telephone, a portable gaming console, network routing equipment, etc.

Debugging and profiling the executable assembly language or compiled code on the target 110 using breakpoints to see the details of the code execution is an intrusive process and affects the operation and performance of the code being executed on circuitry 145. As such, a true understanding of the operation and performance of the code execution on circuitry 145 is not gained through the use of breakpoints.

Figure 2:
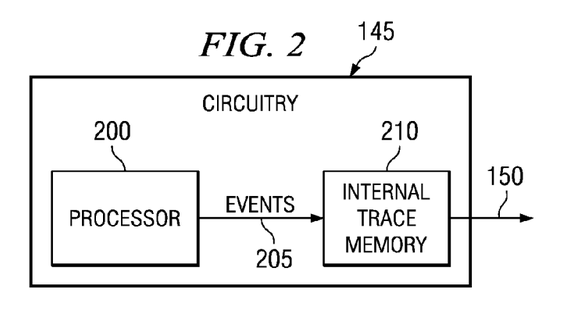
FIG. 2 depicts an embodiment of circuitry where code is being debugged and profiled using a trace.

FIG. 2 depicts an embodiment of circuitry 145 where code is being debugged and profiled using a trace on circuitry 145 to monitor events. Circuitry 145 includes a processor 200 which executes the code. Through the operation of the processor 200 many events 205 may occur that are significant for debugging and profiling the code being executed by the processor 200. The term "events" or "event data" herein is being used broadly to describe any type of stall in which processor 200 is forced to wait before it can complete executing an instruction, such as a CPU stall or cache stall; any type of memory event, such as a read hit or read miss; and any other occurrences which may be useful for debugging and profiling the code being executed on circuitry 145. The event data may be stored on an internal trace memory 210, wherein computer 105 may read the event data from the internal trace memory 210. The internal trace memory 210 may act as a First In First Out (FIFO) memory and records the events 205 in real-time as event data. Computer 105 may in turn read the event data through connection 150 from trace memory 210 in real-time as it is being filled. Inputting the event data into computer 105 enables a user of the computer 105 to see how the execution of the code is being implemented on circuitry 145. Note that the event data may also be directly output to computer 105 through connection 150 without first being stored in trace memory 210.

As successive generations of processors are developed with faster speeds, the number of events occurring on a processor such as processor 200 similarly increases, however, the bandwidth between computer 105 and circuitry 145 through connection 150 is limited. The amount of event data 205 recorded using a trace may exceed the bandwidth of connection 150. As such, for this solution to be implemented a trace may only be run for a very limited amount of time so as to not fill up internal trace memory 210. This situation is analogous to a sink that drains much less water than the faucet is putting into the sink. In order to prevent the sink from overflowing the faucet may only be turned on for a limited amount of time. This solution of only running the trace for a very short time may not be preferable since it would give a very limited view of the execution of the code on circuitry 145. Alternatively, internal trace memory 210 may be very large so as to accommodate the large amount of event data. This may not be preferable either, since trace memory 210 would then take up a large area on circuitry 145 and consume more power.

Figure 3:
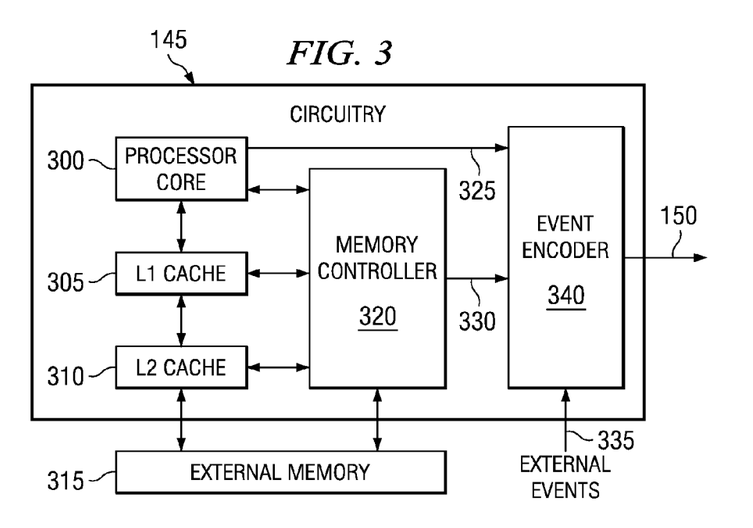
FIG. 3 depicts a preferred embodiment of circuitry where code is being debugged and profiled using a trace.

As such, intelligent ways of reducing the amount of event data without losing any or much information are desirable. FIG. 3 discloses another embodiment of circuitry 145 where code is being debugged and profiled using a trace on circuitry 145 to monitor events. Circuitry 145 includes a processor core 300 which executes the code. Processor 300 interacts with memory controller 320 in order to input data and instructions from various levels of a memory subsystem and output data manipulated according to the instructions. The memory subsystem may include an L1 cache memory 305, which may be divided into a program portion of L1 cache and a data portion of L1 cache; an L2 cache memory 310, which may be larger and slower than the L1 cache memory; and an external memory 315, which may be a random access memory (RAN), or any other suitable external storage. Through executing the code, stalls may occur in the processor core 300 wherein stall signals indicating that these stalls occurred are output from processor core 300 to event encoder 340 through connection 325. Stalls occur when the processor core 300 is forced to wait before it can complete executing an instruction. Stalls can occur for a wide variety of reasons, for example if the processor core 300 has to wait while a data element is being fetched or if the processor core 300 has to wait while an area in cache is being freed up to write the result of an instruction.

Memory controller 320 outputs memory events 330 to event encoder 340. Memory events can also occur for a wide variety of reasons, for example a read hit on the L1 cache 305 or a read miss on the L1 cache 305. Note that certain memory events 330 may also cause a stall, but not all memory events cause a stall. For example a read miss on the L1 cache 305 will also cause a stall until the data that is needed is forwarded to the L1 cache 305. A read hit is an example of a memory event that would not cause a stall.

External events 335 may also be input to event encoder 340. External events 335 may include interrupt routines executed on processor core 300 for interacting with external devices. Monitoring these external events enables a user of computer 105 for example to determine the real-time deadlines for executing the interrupt routines. Event encoder 340 combines and/or selectively outputs the various event data to computer 105 through connection 150. The encoded event data that is sent to computer 105 is decoded, interpreted, and stored in order to enable a user on computer 105 to debug and profile the execution of code on circuitry 145. Related U.S. patent application Ser. No. 11/383,466 "Method of Translating System Events into Signals for Activity Monitoring", by Swoboda et al. details an exemplary process for decoding the event data. The content of the above referenced application is herein incorporated by reference in its entirety.

Figure 4:
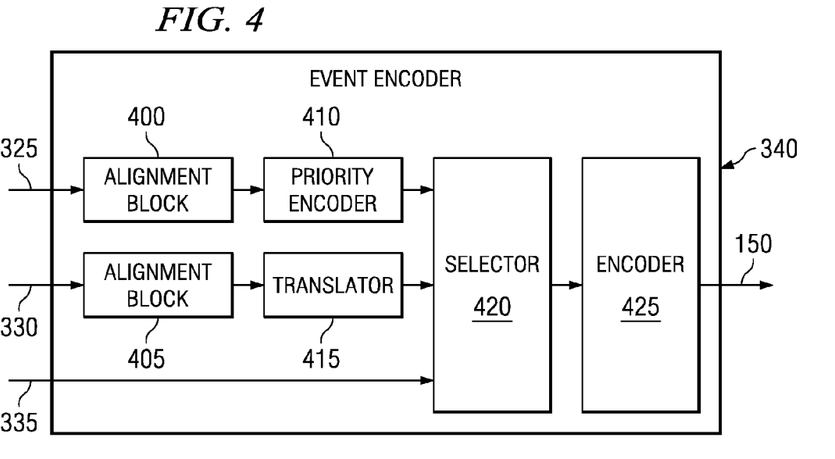
FIG. 4 depicts an example of an implementation of an event encoder.

FIG. 4 depicts an example of an implementation of event encoder 340. Event encoder 340 includes alignment blocks 400 and 405, a stall priority encoder 410, an event translator 415, a selector 420, and a data encoder 425. In the embodiment of FIG. 4, alignment blocks 400 and 405 are used for aligning an event to the instruction where the event occurred. Such alignment enables a causal relationship to be determined between code execution, and the stalls or events of interest. Priority encoder 410 is used to prioritize groups of stalls for cases where multiple stalls occur simultaneously. In at least one embodiment, only the stall with the highest priority in a particular group is output. Translator 415 is used to group events with common characteristics. Selector 420 selects one of the output from priority encoder 410, the output from translator 415, or the external event 335 input to be provided to encoder 425. Encoder 425 combines or compresses the data selected by selector 420. For example,. encoder 425 may include one or more counters to count a number of events occurring within a particular time period. Related U.S. patent application Ser. No. 11/383,464 "Watermark Counter with Reload Register" by Swoboda et al. details one such counter implementation. The content of the above referenced application is herein incorporated by reference in its entirety. Encoder 425 may also include standard bit reduction techniques such as Huffman Coding, or any other suitable bit reduction method.

Figure 5A:
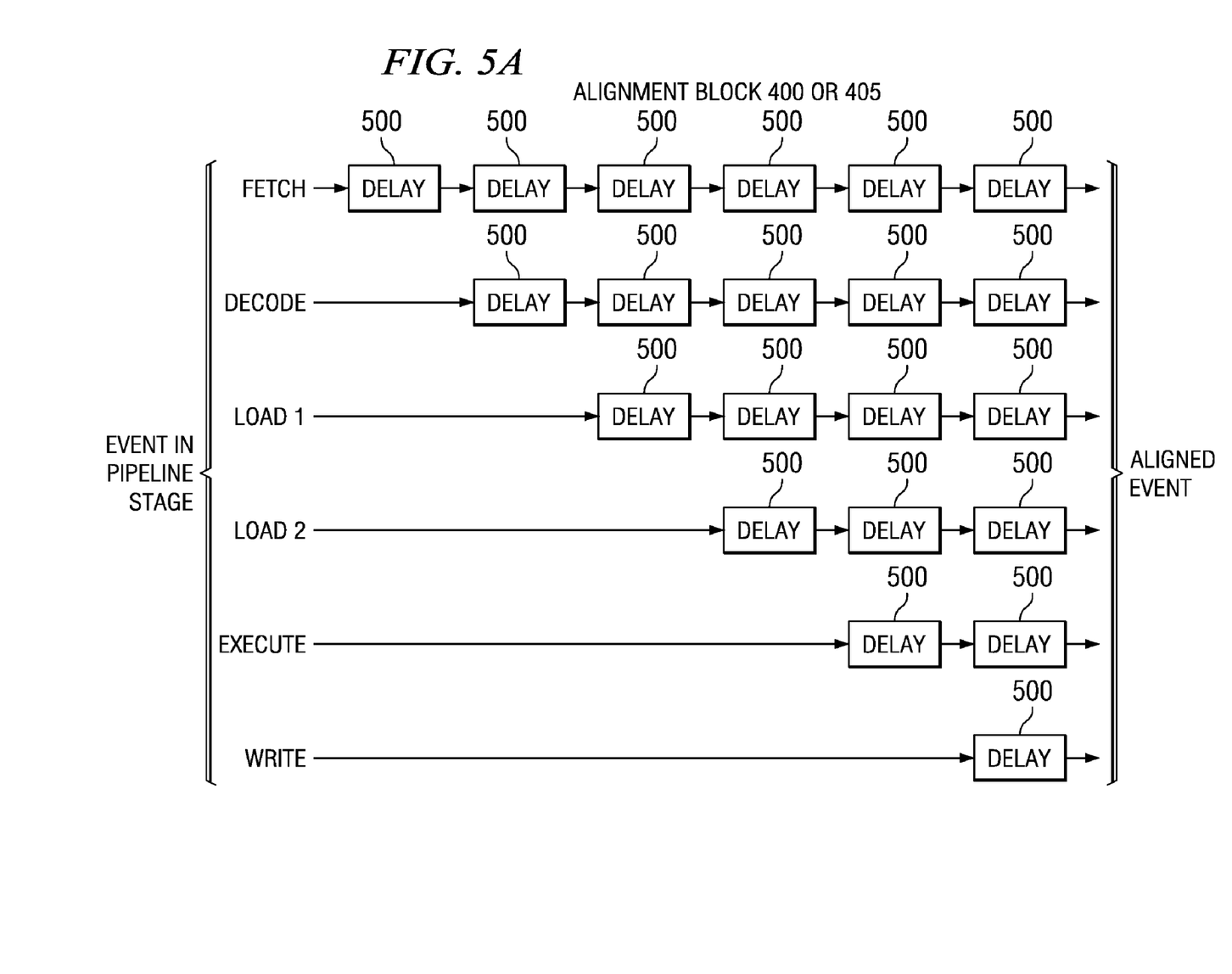
FIG. 5A depicts a preferred implementation of alignment blocks.

FIG. 5A depicts a preferred implementation of alignment blocks 400 or 405. Processors often include processor pipelines for increasing the number of instructions being simultaneously processed by a processor. As such, different phases (fetch, decode, etc.) of multiple instructions may be performed simultaneously by a processor on any given clock cycle. In the example shown in FIG. 5A, a processor that has a six stage pipeline may include a stage for fetching the next instruction, decoding the instruction, loading a first data element, loading a second data element, executing the instruction on the data elements, and writing the result of the execution. For a software debugger to ascertain what is occurring at each phase for any given instruction, the result for each phase of an instruction is fed through a series of delay circuits 500 in the alignment block 400 or 405. For example, since a fetch operation is the first phase in the six stage pipeline, the result of the fetch operation is fed through a series of six delay circuits 500 in order to be aligned with the other stages of that instruction. Similarly, since a write operation is the last phase in the six stage pipeline the result of the write operation is fed through a single delay circuit in order to be aligned with the other stages of that instruction.

Figure 5B:
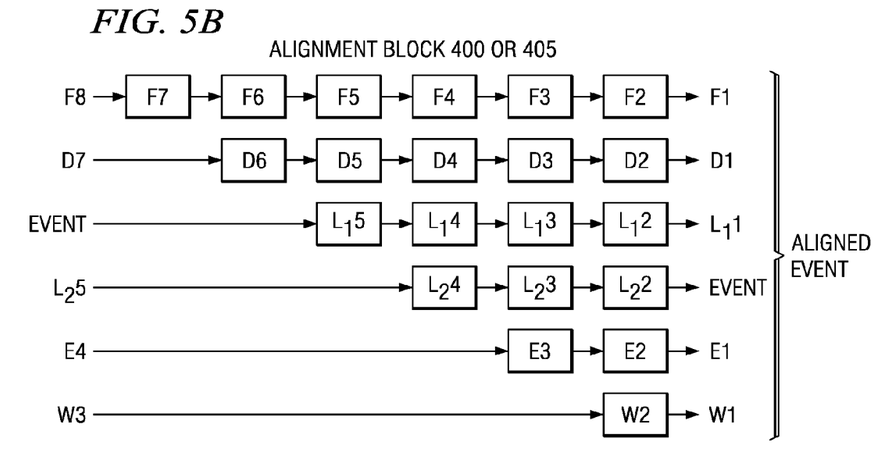
FIG. 5B depicts the operation of the alignment blocks.

FIG. 5B illustrates the implementation of the alignment block 400 or 405. FIG. 5B illustrates a series of eight instructions being executed by processor core 300. In the example of FIG. 5B, processor core 300 (FIG. 3) has most recently completed different stages of the pipeline for multiple instructions. In particular, the processor core 300 has completed the fetch stage for the eighth instruction, the decode stage for the seventh instruction, loading a first data element for the sixth instruction where an event has occurred, loading a second data element for the fifth instruction, executing the fourth instruction, and writing the result of the third instruction. Note that an event that may occur in loading a first data element for the sixth instruction may be, for example, a stall caused by a read miss. The result of each stage is fed into a series of delay circuits 500 in alignment block 400 or 405. As the processor core 300 completes more instructions, the results are propagated through the delay circuits 500 until an aligned instruction is output from the alignment block 400 or 405.

The output of the alignment block 400 or 405 shown in FIG. 5B has aligned all of the stages of the first instruction. Note that an event has occurred for loading a second data element for the first instruction. Thus, the event that occurred is associated with the first instruction and a causal relationship of code execution and the event is made. As such, events are correlated to the instructions where they occurred on a cycle by cycle basis of said processor core 300.

Note that while the above alignment blocks 400 and 405 were described with reference to a processor with a six stage pipeline, a processor with more or less stages in its pipeline may still be used to align the instructions. This may be accomplished by adjusting the number of delay circuits in each stage such that the first stage would have as many delay circuits as the number of stages in the pipeline and each successive stage would have one less delay circuit. Further, while the above alignment blocks 400 and 405 were described as utilizing a series of delay circuits any other known method of aligning the instructions may be used.

Figure 6:
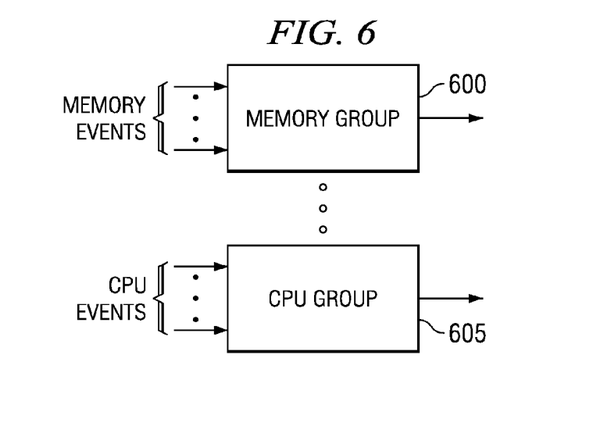
FIG. 6 depicts a preferred implementation of either a priority encoder or a translator.

FIG. 6 depicts an implementation that is applicable to encoder 410 and translator 415. In particular, for translator 415 the aligned memory events may organized as different logical groups depending on the type of memory event in order to group events with common characteristics. Each logical group would then output only one signal so as to communicate a common memory event characteristic of that group. In this way, less bandwidth is needed to communicate the event information that might otherwise be needed.

For example, memory events may be grouped in one or more memory groups 600, one or more CPU groups 605, or any other logical grouping of memory events. Note that the CPU group 605 may group memory events that are caused by the processor core 300. Through the operation of processor core 300 some memory events may occur on all or most clock cycles. For example, a read hit on the L1 cache may occur on all, or most, clock cycles. As such, without the embodiments of the invention, it would require a relatively large amount of bandwidth to communicate all of the occurrences of these types of memory events. As opposed to outputting a value indicating the occurrence of an event every time a read hit or read miss on the L1 cache occurs, the memory events for the higher level memories may be output and interpreted in order to determine the read hits and misses on the L1 cache. The higher level memory events may occur much less frequently and as such require much less bandwidth. As such, if there are no read hits on the L2 cache or the external memory, then that would mean that a read hit has occurred on the L1 cache. Also, if a read hit on the L2 cache is output, then that would mean that a read miss on the L1 cache has occurred.

For priority encoder 410, the aligned stalls are organized into different logical groups depending on the type of stall in order to set priorities for which stall to output if multiple stalls occur simultaneously. By prioritizing the stalls, more meaning may be extracted from the stall signals. For example, if a read miss occurs then the dirty line in cache may be evicted and replaced with the desired data. This dirty line in cache is referred to as a victim and may be written back to a higher level in memory. As such, two stalls occur simultaneously. One stall indicating a read miss and another stall indicating a victim write-back. If both of these stall types are grouped together and the victim write-back stall is given a higher priority then each of these stalls will be seen as separate stalls. In particular, first the victim write-back stall would be asserted until the dirty line in cache is written back to a higher level in memory. If this stall is being monitored then a determination can be made as to the efficiency of a victim write-back. When this stall is no longer asserted the read miss stall would become visible until the data needed is written in the dirty line in cache. As such, instead of a read miss stall indicating the entire duration of the victim write-back and the time to fill the line in cache, by prioritizing the stalls the read miss gains a new meaning. In particular, the read miss stall indicates the duration of time to fill the line in cache. As such, by prioritizing groups of stalls new meaning and detail may be provided for each stall signal. Related U.S. patent application Ser. No. 11/383, 465 "Real-time Prioritization of Stall or Event Information" by Sohm et al., describes this process in detail. The content of the above referenced application is herein incorporated by reference in its entirety.

Figure 7A:
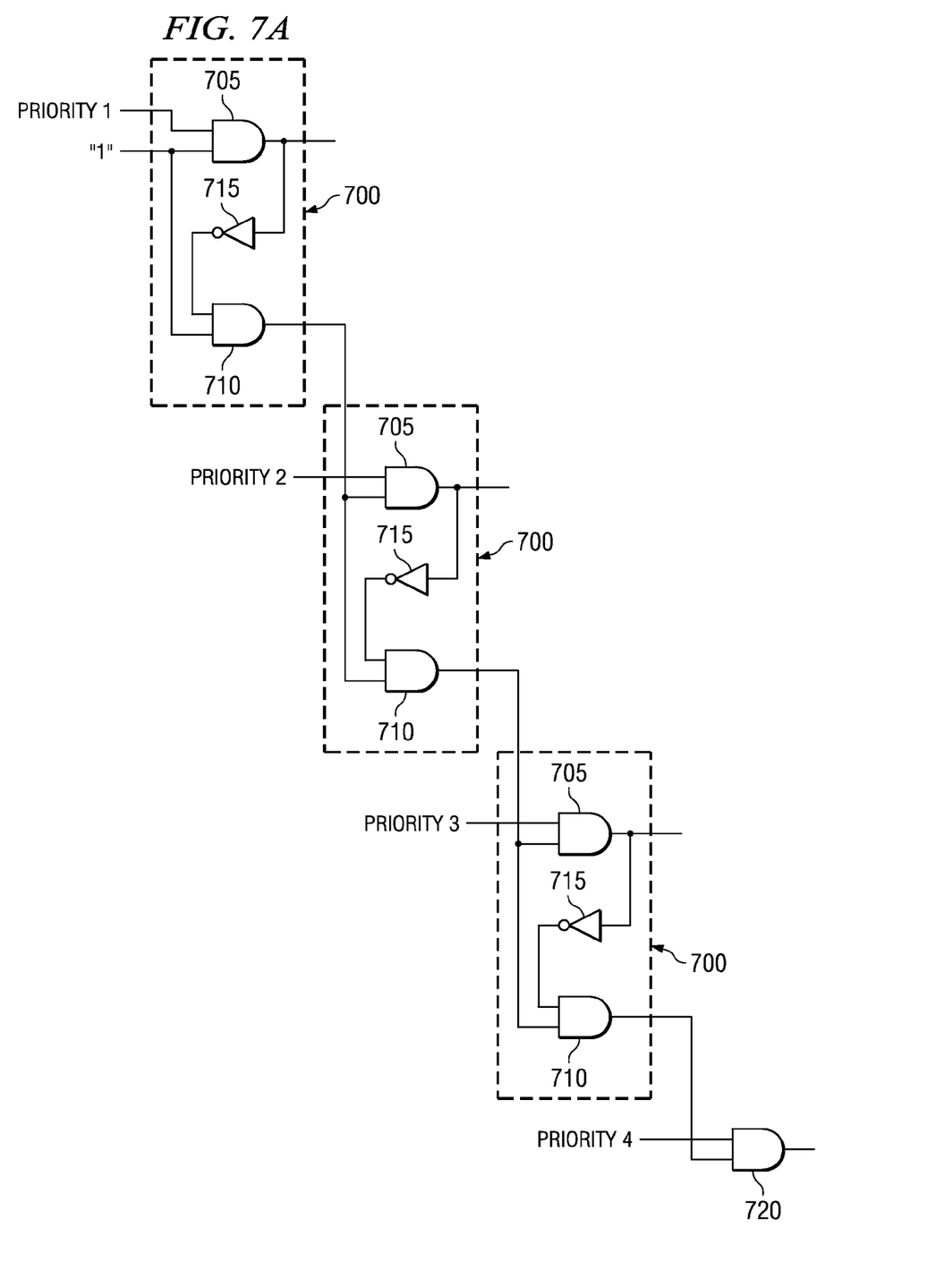
FIG. 7A depicts an implementation of any of the groups shown in FIG. 6 for prioritizing the input events.
Figure 7B:
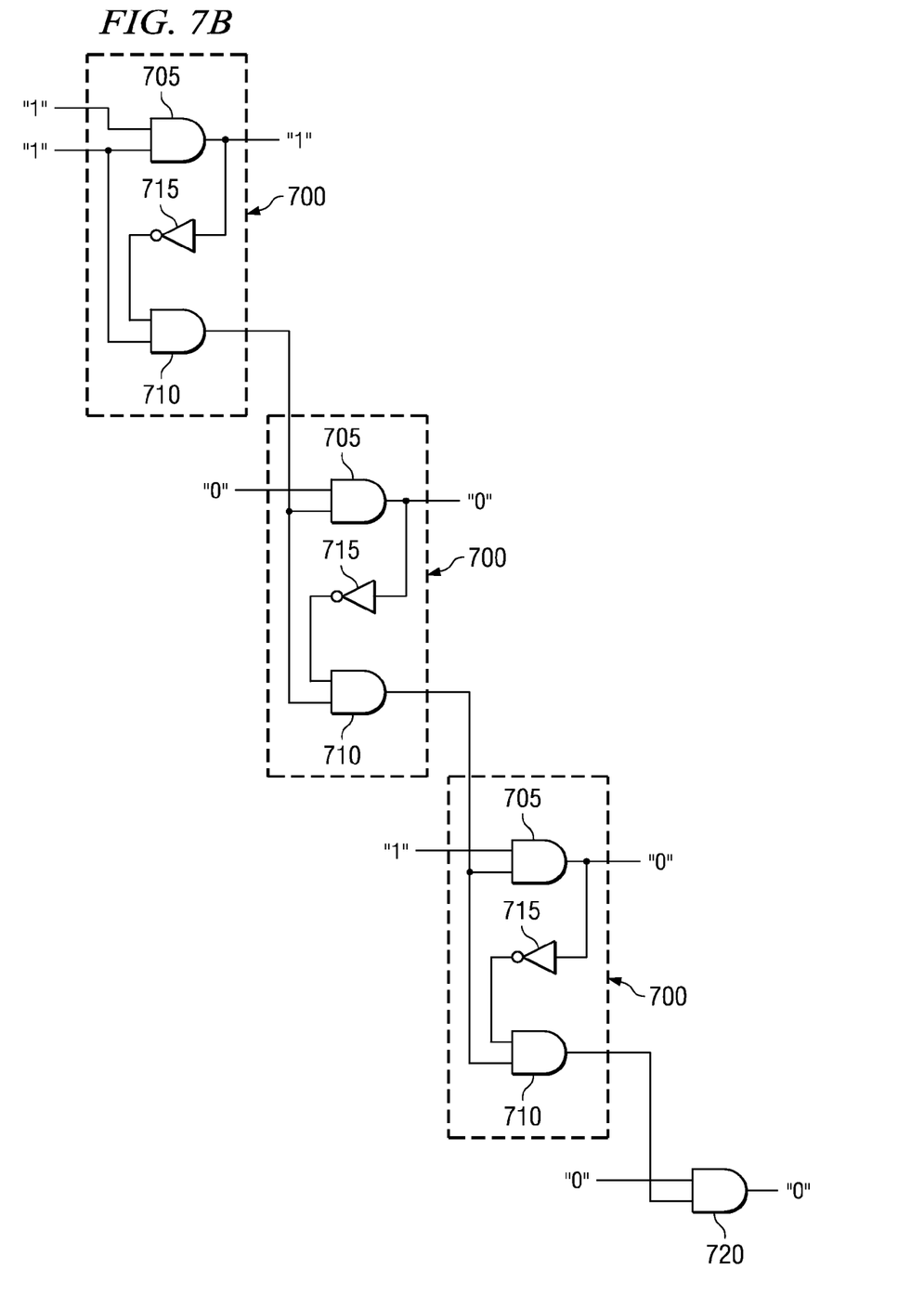
FIG. 7B depicts an example of the operation of FIG. 7A.
Figure 7C:
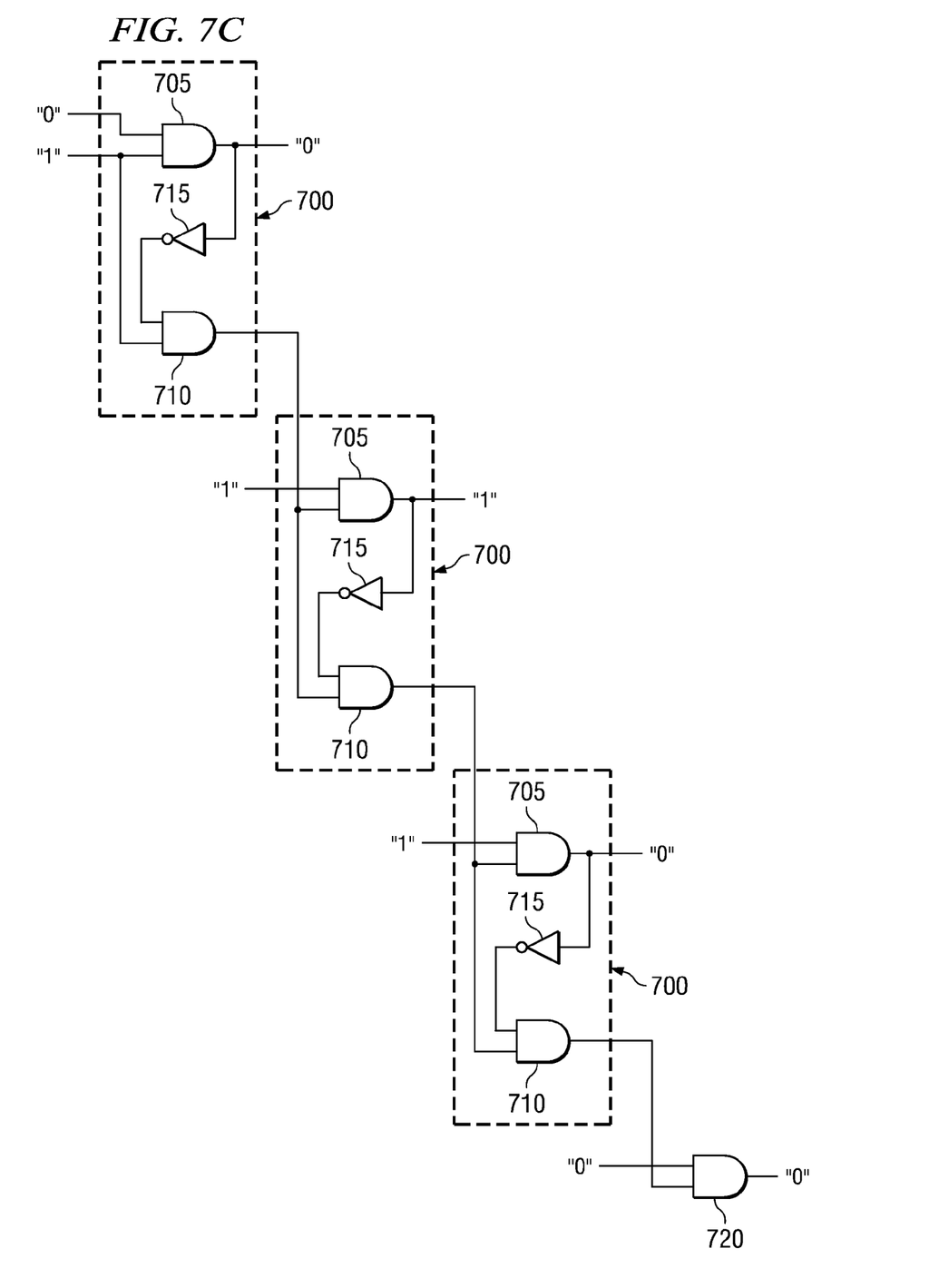
FIG. 7C depicts an example of the operation of FIG. 7A.

FIG. 7A depicts a priority encoder implementation of any of groups 600 or 605. FIG. 7A includes a series of logic blocks 700 where the output from one block is provided as an input to the next. The logic block 700 at the top has the highest priority and the logic block 700 at the bottom has the lowest priority. Each logic block 700 outputs a logical combination of inputs such that if multiple events occur simultaneously, only the highest priority event is visible on the output. In a preferred embodiment, each logic block 700 includes two AND gates 705 and 710 as well as an inverter 715. An AND gate produces a logical ANDing of the inputs to the AND gate. An inverter produces a logical inversion of the input to the inverter. In particular, a logical "1" value is input to both AND gates 705 and 710 of the first logic block 700. AND gate 705 also receives an input from the highest priority event signal. The highest priority event signal indicates whether or not the highest priority event has occurred. A logical "1" would be input to AND gate 705 if the event occurred and a logical "0" would be input to AND gate 705 if the event did not occur. As such, the first logic block 700 will output a value of "0" if the input from the highest priority event signal is "0" since the logical ANDing of a "0" and a "1" produces a "0". Logic block 700 would produce a value of "1" if the input from the highest priority event signal is "1" since the logical ANDing of a "1" and a "1" produces a "1". An inverter 715 inverts whatever signal is output from AND gate 705 and inputs the result as another input to AND gate 710. The output from AND gate 710 from the first logic block 700 is fed into the inputs of AND gates 705 and 710 for the next logic block 700. Each successive logic block 700 receives one input from the next lowest priority event signal and another input from the output of AND gate 710 from the previous logic block 700. For the lowest priority event signal a simple AND gate 720 is used to logically AND the values from the lowest priority event signal and the output of AND gate 710 from the previous logic block 700. FIGS. 7B and 7C illustrate the operation of the operation of the priority encoder.

FIG. 7B depicts the operation of the priority encoder where the highest priority event is occurring simultaneously with third priority event. As illustrated, AND gate 705 produces a "1" output because of the two "1" inputs. Inverter 715 inverts the "1" output from AND gate 705 to produce a "0" input for AND gate 710, therefore AND gate 710 produces a "0" output to the second logic block 700. Both AND gates 705 and 710 for the second logic block receive the "0" input and therefore in turn produce a "0" output. The "0" output from AND gate 710 in the second logic block is input to the third logic block. Similarly, Both AND gates 705 and 710 for the third logic block receive the "0" input and therefore in turn produce a "0" output. Note that even though a "1" is input from the third priority event signal, the logical ANDing of a "0" and a "1" produces a "0". As such, the event occurring on the third priority event signal is masked by the higher priority event occurring on the highest priority event signal. The "0" output from AND gate 710 in the third logic block is fed into AND gate 720 to also produce a "0" output.

FIG. 7C depicts the operation of the priority encoder where the second priority event is occurring simultaneously with third priority event. As illustrated, AND gate 705 produces a "0" output because of the "0" input from the highest priority event signal. Inverter 715 inverts the "0" output from AND gate 705 to produce a "1" input for AND gate 710, therefore AND gate 710 produces a "1" output to the second logic block 700. Both AND gates 705 and 710 for the second logic block receive the "1" input. AND gate 705 for the second logic block 700 produces a "1" output because of the two "1" inputs. Inverter 715 for the second logic block 700 inverts the "1" output from AND gate 705 to produce a "0" input for AND gate 710 of the second logic block 700, therefore AND gate 710 produces a "0" output to the third logic block 700. The "0" output from AND gate 710 in the second logic block is input to the third logic block. Both AND gates 705 and 710 for the third logic block receive the "0" input and therefore in turn produce a "0" output. Note that even though a "1" is input from the third priority event signal, the logical ANDing of a "0" and a "1" produces a "0". As such, the event occurring on the third priority event signal is masked by the higher priority event occurring on the second priority event signal. The "0" output from AND gate 710 in the third logic block is fed into AND gate 720 to also produce a "0" output. As such, the priority encoder only outputs the highest priority event if multiple events in a group occur simultaneously. Since only the highest priority event is asserted then any other lower priority events are not double-counted.

Disclosed above is a system and method of tracing a group of processor events in real-time in order to enable a programmer to debug and profile the operation and execution of code on the processor. This may be accomplished by running one or more traces on the same or different groups of processor events in order to gain a full understanding of how code is being executed by the processor.

While various system and method embodiments have been shown and described herein, it should be understood that the disclosed systems and methods may be embodied in many other specific forms without departing from the spirit or scope of the invention. The present examples are to be considered as illustrative and not restrictive. The intention is not to be limited to the details given herein, but may be modified within the scope of the appended claims along with their full scope of equivalents.

What is claimed is:

1. A system comprising:
a circuit configured to execute a series of instructions and output circuit event data corresponding to the execution of said instructions, said circuit executing said instructions in a pipeline wherein different phases of multiple instructions are performed simultaneously;
an event encoder coupled to said circuit that inputs said circuit event data and external event data corresponding to execution of said instructions and outputs encoder event data, said event encoder comprising an alignment element aligning event data in a particular phase of said pipeline to said instruction prompting said event data; and
a monitoring device coupled to said event decoder, said monitoring device inputs, decodes, analyzes and stores said encoded event data.

2. The system of claim 1, wherein:
said alignment element comprises a plurality of delay circuit chains, one delay circuit chain corresponding to each stage in said pipeline, each delay circuit chain including a number of stage delays corresponding to said stage in said pipeline.

3. A system comprising:
a circuit configured to execute a series of instructions and output circuit event data corresponding to the execution of said instructions;
an event encoder coupled to said circuit that inputs said circuit event data and external event data corresponding to execution of said instructions and outputs encoder event data, wherein said event encoder comprises
an alignment element that correlates said event data to the instructions that prompted said event data,
a priority element that prioritizes groups of said correlated event data and outputs the highest priority event for each group as prioritized event data,
a translator element that groups said correlated events with common characteristics and outputs one signal corresponding to the common characteristic of that group as translated event data; and
a monitoring device coupled to said event decoder, said monitoring device inputs, decodes, analyzes and stores said encoded event data.

4. The system of claim 3, wherein:
said event decoder comprises a selector for selecting between said prioritized event data, said translated event data and said external event data.

5. The system of claim 4, wherein:
said event decoder further comprises a compression element that compresses said selected event data and outputs said encoded event data to said monitoring device.

6. A method comprising:
executing a series of instructions on a circuit including executing said instructions in a pipeline wherein different phases of multiple instructions are performed simultaneously;
outputting circuit event data corresponding to the execution of said instructions;
outputting external event data corresponding to the execution of said instructions;
encoding said circuit event data and said external event data into encoded event data;
aligning event data in a particular phase of said pipeline to said instruction prompting said event data;
inputting said encoded event data to a monitoring device; and
decoding, analyzing and storing said encoded event data on said monitoring device.

7. The method of claim 6, wherein:
said step of aligning event data in a particular phase of said pipeline includes delaying event data a number of stage delays corresponding to said stage in said pipeline.

8. A method comprising:
executing a series of instructions on a circuit;
outputting circuit event data corresponding to the execution of said instructions;
outputting external event data corresponding to the execution of said instructions;
encoding said circuit event data and said external event data into encoded event data;
correlating said circuit event data in the instructions that prompted said event data;
grouping said correlated events with common characteristics;
outputting one signal corresponding to the common characteristic of that group for each group as translated event data;
prioritizing groups of said correlated event data; and
outputting the highest priority event for each group as prioritized event data;
inputting said encoded event data to a monitoring device; and
decoding, analyzing and storing said encoded event data on said monitoring device.

9. The method of claim 8, further comprising:
selecting one of said external event data, prioritized event data, and translated event data.

10. The method of claim 9, further comprising:
compressing said selected event data; and
outputting said compressed event data as said encoded event data to said monitoring device.

* * * * *